United States Patent
Ehlen (10) Patent No.: US 9,450,358 B2
(45) Date of Patent: Sep. 20, 2016

(54) FLOATING BUS BAR AND CONNECTOR WITHIN CHASSIS AND POWERED SLIDE RAILS

(71) Applicant: Facebook, Inc., Menlo Park, CA (US)

(72) Inventor: Jon Brian Ehlen, Newark, CA (US)

(73) Assignee: FACEBOOK, INC., Menlo Park, CA (US)

( * ) Notice: Subject to any disclaimer, the term of this patent is extended or adjusted under 35 U.S.C. 154(b) by 143 days.

(21) Appl. No.: 14/314,746

(22) Filed: Jun. 25, 2014

(65) Prior Publication Data

US 2014/0308828 A1 Oct. 16, 2014

Related U.S. Application Data

(63) Continuation-in-part of application No. 13/655,343, filed on Oct. 18, 2012, now Pat. No. 8,911,251.

(51) Int. Cl.
*H01R 13/64* (2006.01)
*H01R 25/14* (2006.01)
*H05K 7/14* (2006.01)

(52) U.S. Cl.
CPC ............ *H01R 25/14* (2013.01); *H05K 7/1489* (2013.01); *H05K 7/1492* (2013.01)

(58) Field of Classification Search
CPC ............ H01R 25/142; H01R 13/4532; H01R 13/625
USPC .................................. 439/251, 110, 118–122
See application file for complete search history.

(56) References Cited

U.S. PATENT DOCUMENTS

| | | | |
|---|---|---|---|
| 4,017,770 A | 4/1977 | Valfre | |
| 5,618,197 A | 4/1997 | Bodahl-Johnsen | |
| 5,759,051 A * | 6/1998 | Cancellieri | H01R 25/142 439/118 |
| 6,115,242 A | 9/2000 | Lambrecht | |
| 6,209,979 B1 * | 4/2001 | Fall | A47B 88/0422 312/319.1 |
| 6,239,975 B1 | 5/2001 | Otis | |
| 7,661,966 B2 * | 2/2010 | Ohanesian | H01R 25/142 439/120 |
| 7,784,888 B2 * | 8/2010 | Oh | A47B 51/00 312/223.6 |
| 8,109,652 B2 * | 2/2012 | Chen | F21V 19/0045 362/218 |

OTHER PUBLICATIONS

Non-Final Office Action mailed May 2, 2014, U.S. Appl. No. 13/655,343 by Ehlen, J., filed Oct. 18, 2012.
Notice of Allowance mailed Aug. 27, 2014 for U.S. Appl. No. 13/655,343 by Ehlen, J., filed Oct. 18, 2012.
Notice of Allowance mailed Oct. 22, 2014 for U.S. Appl. No. 13/655,343 by Ehlen, J., filed Oct. 18, 2012.

* cited by examiner

*Primary Examiner* — Xuong Chung Trans
(74) *Attorney, Agent, or Firm* — Perkins Coie LLP

(57) ABSTRACT

Technology is provided for a powered slide rail. The powered slide rail includes an outer segment including a first elongate conductor, a middle segment slidably nested with the outer segment that includes a second elongate conductor, and a first conductive element connected to the second elongate conductor and positioned for sliding contact with the first elongate conductor. An inner segment is slidably nested with the middle segment and includes a second conductive element positioned for sliding contact with the second elongate conductor.

15 Claims, 10 Drawing Sheets

FLOATING BUS BAR AND CONNECTOR WITHIN CHASSIS AND POWERED SLIDE RAILS

CROSS-REFERENCE TO RELATED APPLICATIONS

This application is a continuation-in-part of U.S. patent application Ser. No. 13/655,343, filed Oct. 18, 2012, the disclosure of which is hereby incorporated by reference in its entirety.

TECHNICAL FIELD

This patent application generally relates to data storage server configurations, and more specifically, to connectors and powered slide rails for providing power to sliding trays in a chassis.

BACKGROUND

Many servers and other computer systems contain components mounted on sliding trays, which allow a user to easily access and replace the components without having to open the chassis of the computer system. Conventionally, a flexible power cable is connected to the rear of the sliding tray to provide power to components on the tray. The flexibility of the power cable allows the cable to remain connected when the tray is slid out of the chassis. However, the power cable must be as long as the desired travel length of the tray. Thus, if access to the entire length of the sliding tray is desired, the power cable must be as long as the length of the tray. This causes the power cable to occupy a considerable amount of space when the tray is fully inside the chassis, and the occupied space impedes airflow within the chassis, limiting cooling of the components within the chassis.

BRIEF DESCRIPTION OF THE DRAWINGS

The connectors and powered slide rails introduced here may be better understood by referring to the following Detailed Description in conjunction with the accompanying drawings, in which like reference numerals indicate identical or functionally similar elements.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of the embodiments as defined by the appended claims.

DETAILED DESCRIPTION

Overview

To improve airflow inside a chassis and to reduce the amount of occupied space inside the chassis, embodiments of the invention provide a floating bus bar and a bus bar connector for providing power to components on a sliding tray enclosed by the chassis. The bus bar connector includes a power terminal and two connecting fingers that engage with two floating bus bars, which are mounted inside the chassis in a direction parallel to the sliding direction of the sliding tray. The connecting fingers of a bus bar connector remain in contact with the bus bars as the sliding tray moves. The power terminal includes two conductors for connecting to a high supply voltage and a low supply voltage. Each conductor is coupled to one of the connecting fingers, and each connecting finger is positioned to contact with and press against one of the floating bus bars. The bus bars, connecting fingers, and power terminal are less obtrusive than a flexible power cable and other conventional solutions and can be mounted within the chassis without significantly impeding airflow within the chassis.

Powered slide rails are disclosed for continuously powering a chassis as it is pulled from its cubby. In various embodiments, a powered slide rail includes multiple slidably nested or telescoping segments, each of which includes an elongate conductor. In some embodiments, a conductive element, such as flexible spring finger brushes, electrically connect the elongate conductors of the telescoping segments. As the segments telescope with respect to each other, power is maintained along the elongate conductors through the flexible spring finger brushes. In some embodiments, the powered slide rails include connectors on both ends to connect the slide rails between the cubby and the chassis.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

Figure 1A:
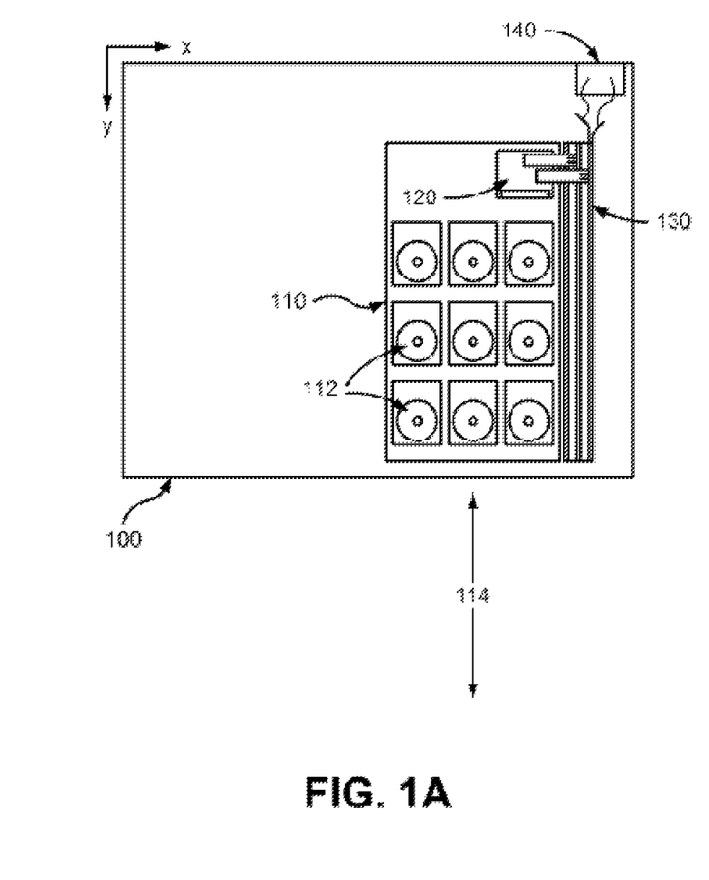
FIG. 1A is a top-down view of a chassis containing a sliding tray having a sliding bus bar power connector, according to one embodiment.
Figure 1B:
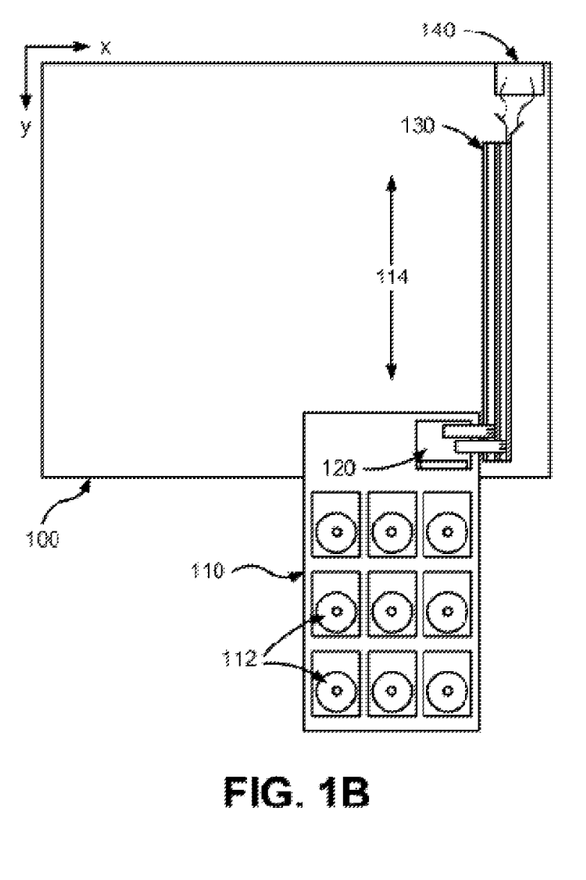
FIG. 1B is a top-down view of the chassis in FIG. 1A that illustrates the motion of the sliding tray, according to one embodiment.

A sliding bus bar connector provides power to a sliding tray within a chassis of a computing asset. FIGS. 1A and 1B illustrate an example chassis 100 including a sliding tray 110, a sliding bus bar connector 120, and bus bars 130. Although only one sliding tray 110 is shown, the chassis 100 may also include additional sliding trays 110. FIGS. 1A and B are illustrated with respect to a set of three axes that are used consistently throughout the figures in order to show how the views in the figures are oriented relative to each other. In addition to the x- and y-axes that are shown, FIGS. 1A and B also include a z-axis (not pictured) that is oriented upward in a direction perpendicular to the plane of the page.

A computing asset housed in the chassis 100 may be any device that contains electronic components. For example, the computing asset may be a server or a personal computer capable of running an operating system and executing software applications. Alternatively, the computing asset may be a limited-function device, such as a network-attached storage system with a memory controller and a plurality of hard disks or solid state drives.

The sliding tray 110 within the chassis 100 is used for retaining electronic components 112 of the computing asset. In the illustrated embodiment, some of the electronic components 112 are hard disk drives. The sliding tray 110 may also include additional or different components 112, such as solid state drives, memory controllers, network controllers, processors, or other electronic devices. The sliding tray 110 is moveably mounted within the chassis 100 in a manner that allows the sliding tray 110 to slide between a first position, shown in FIG. 1A, and a second position, shown in FIG. 1B, along a sliding direction 114. In the first position, the sliding tray 110 is within the chassis 100. Being within the chassis 100 protects the components 112 from external hazards and allows the components 112 to be cooled by cooling systems that regulate the internal temperature of the chassis 100 (e.g., fans). In the second position, a portion of the sliding tray 110 is outside of the chassis 100, allowing a user to easily access the components 112 on the tray 110.

The sliding bus bar power connector 120 conductively couples the electronic components 112 in the sliding tray 110 to bus bars 130 mounted within the chassis 100. The bus bars 130 are connected to a power supply unit 140, which connects to an external power source. In one embodiment, the chassis 110 is mounted on a server rack and the power supply unit 140 is a connector that engages with a set of power bars mounted to the rear of the server rack. Alternatively, the power supply unit 140 includes a circuit that converts alternating current from a power outlet into direct current or another form more suitable for use by components in the sliding tray 110.

Together, the sliding bus bar connector 120, the bus bars 130, and power supply unit 140 provide supply voltages powering the electronic components 112. The sliding bus bar connector 120 is secured to the sliding tray 110 in a position that allows the sliding bus bar connector 120 to make contact with the bus bars 130 as the sliding tray 110 is moved between the first position and the second position along the sliding direction 114. In one embodiment, the connector 120 is mounted at a corner of the sliding tray 110 distal to an opening of the chassis 100. Thus, the components 112 remain connected to the supply voltages regardless of whether the sliding tray 110 is in the first position, in the second position, or being moved between the first and second positions. In addition, the bus bars 130 may be positioned within the chassis 110 so they do not significantly impede airflow within the chassis 110. This allows for more efficient interior cooling than conventional methods of connecting a sliding tray to a power supply, such as a pair of flexible power cables.

Although the chassis 100 described in conjunction with FIGS. 1A and 1B may house any type of computing asset, the improvements provided by the chassis 100 are particularly beneficial when a large number of storage devices, such as hard disk drives or solid state drives, are housed by the chassis 100. In these embodiments, the storage devices are retained in the sliding tray 110, beneficially allowing a user to access the storage devices without removing a side panel of the chassis 100. In addition, because the connector 120 and bus bars 130 may provide power to the components 112 on the sliding tray 110 regardless of the tray's position, a user may perform maintenance on one of the storage devices without powering down the other storage devices or components on the sliding tray 110. For example, this configuration is beneficial when the storage devices are part of a redundant array of independent disks (RAID) and replacement of single storage device is needed without disrupting the operation of the computing asset.

Figure 2A:
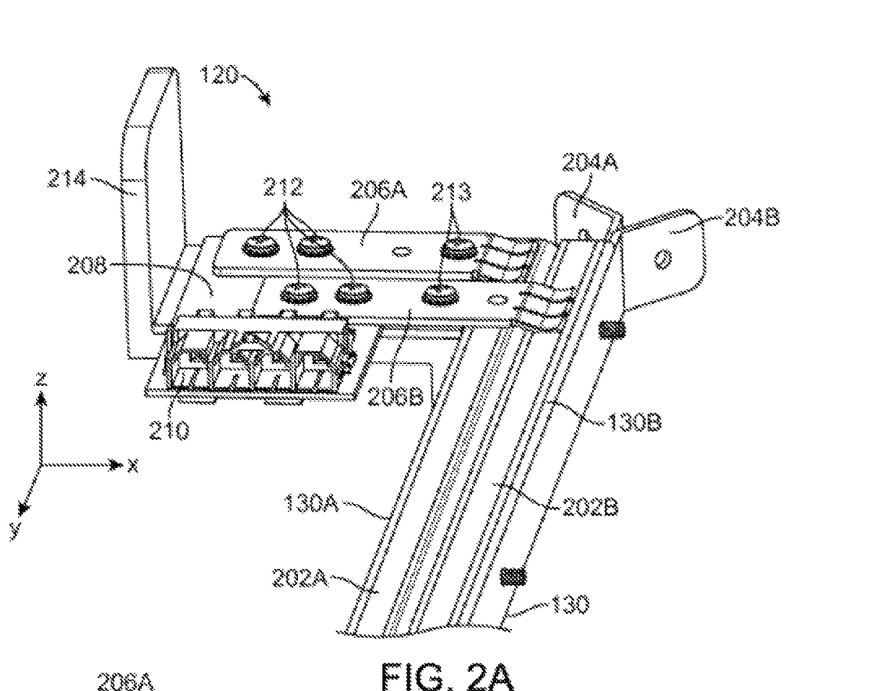
FIGS. 2A and 2B are perspective views of a sliding bus bar power connector and a pair of floating bus bars, according to one embodiment.

FIG. 2A is a perspective view of an embodiment of the sliding bus bar connector 120 and bus bars 130. In the embodiment shown by FIG. 2A, two bus bars 130A, 130B are mounted to a side of the sliding tray 110 (not shown in FIGS. 2A and 2B) so that a single sliding bus bar connector 120 engages both bus bars 130A, 130B. For purposes of illustration, in the embodiment shown by FIGS. 2A and 2B, the power supply unit 140 maintains the first bus bar 130A at a high supply voltage and maintains the second bus bar 130B at a low supply voltage. In other embodiments, the voltages of the bus bars 130A, 130B may be reversed.

Figure 2B:
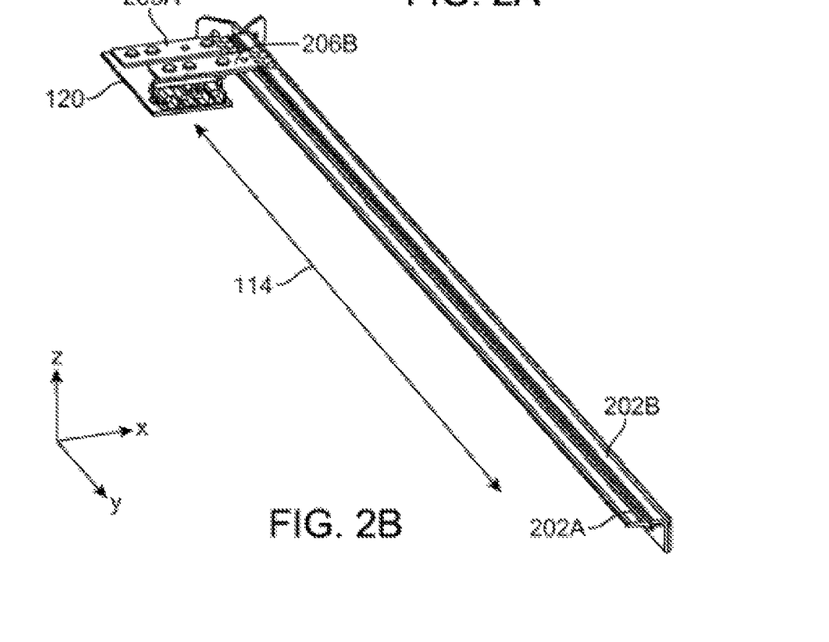

Each bus bar 130A, 130B includes a contacting strip 202A, 202B along a top surface and a supply terminal 204A, 204B at a rear surface. The contacting strip 202A, 202B physically contacts a connecting finger 206A, 206B of the connector 120 to conduct electricity from the power supply 140 to computing devices in the sliding tray 100 via the finger 206A, 206B. The supply terminal 204A, 204B conductively couples the bus bar 130A, 130B to the power supply unit 140 to provide power to maintain the bus bars 130A, 130B at the appropriate supply voltages. In one embodiment, each supply terminal 204A, 204B includes a hole for connecting a power cable to the bus bars 130A, 130B using a screw terminal or other suitable method.

Each connecting finger 206A, 206B of the sliding bus bar connector 120 contacts with and presses against a contacting strip 202A, 202B on the corresponding bus bar 130A, 130B. This forms an electrical connection between the connecting finger 206A, 206B and the bus bar 130A, 130B. Thus, the first connecting finger 206A is at the high supply voltage of the bus bar 130A and the second connecting finger 206B is at the low supply voltage or the bus bar 130B.

The sliding bus bar connector 120 also includes a printed circuit board (PCB) 208, with a power terminal 210 mounted to the PCB 208. The power terminal 210 includes conductors each for coupling to one of the supply voltages from the first bus bar 130A and from the second bus bar 130B to the electronic components 112 on the sliding tray 100. For example, the first conductor of the power terminal 210 is coupled to the first connecting finger 206A to provide a high supply voltage, and the second conductor is coupled to the second connecting finger 206B to provide the low supply voltage. In one embodiment, the conductors of the power connector 210 are coupled to the corresponding connecting fingers 206A, 206B via conductive traces on the PCB 208. In some embodiments, the connector 120 may include multiple power terminals 210. For example, the embodiment illustrated in FIGS. 2A and 2B includes four power terminals 210 in a single housing mounted on the PCB 208.

The connecting fingers 206A, 206B are secured to the PCB 208 with a plurality of fasteners 212 (e.g., screws). In some embodiments, the PCB 208 is mounted to a carrier bracket 214, and the fasteners 212 also secure the connecting fingers 206A, 206B and PCB 208 to the carrier bracket 214. The sliding bus bar connector 120 may also include additional fasteners 213 that directly secure the connecting fingers 206A, 206B to the carrier bracket 214. To prevent unwanted conduction with the connecting fingers 206A, 206B and the PCB 208, the carrier bracket 214 may be insulated (e.g., with a powder coat) or made of a non-conductive material.

In some embodiments, the non-contacting surfaces of the bus bars 130A, 130B and the connecting fingers 206A, 206B may be covered with a non-conductive material, such as a powder coat, to prevent unwanted electrical conduction. For example, every surface of the bus bars 130A, 130B apart from the contacting strips 202A, 202B and the supply terminals 204A, 204B may be powder coated. Similarly, every surface of the connecting fingers 206A, 206B apart from the area contacting the contacting strips 202A, 202B may be powder coated.

FIG. 2B is a different perspective view of the sliding bus bar connector 120 and the sliding bus bars 130 shown in FIG. 2A. Relative to FIG. 2A, the view of FIG. 2B is rotated counterclockwise about the z-axis and zoomed out so that the entire length of the bus bars 130 is visible. As the sliding tray 110 is moved along the sliding direction 114, the connecting fingers 206A, 206B remain in contact with the contacting strips 202A, 202B. Accordingly, the conductors in the power terminal 210 remain conductively coupled to the corresponding bus bars 130A, 130B.

In other embodiments, the bus bars may be configured differently than in the description presented with reference to FIGS. 1A-2B. For example, a single bus bar is mounted on each side of the sliding tray 100, which has two separate connectors each for engaging with one of the bus bars. In this configuration, each connector includes a single connecting finger. In another example, the chassis includes a single bus bar providing a supply voltage, and a different connection method (e.g., a flexible power cable) provides the second supply voltage to the sliding tray 110. Other embodiments may include three or more bus bars to provide three or more voltages to the components 112 in the sliding tray 110 (e.g., a positive supply voltage, a negative supply voltage, and a ground or reference voltage).

Figure 3A:
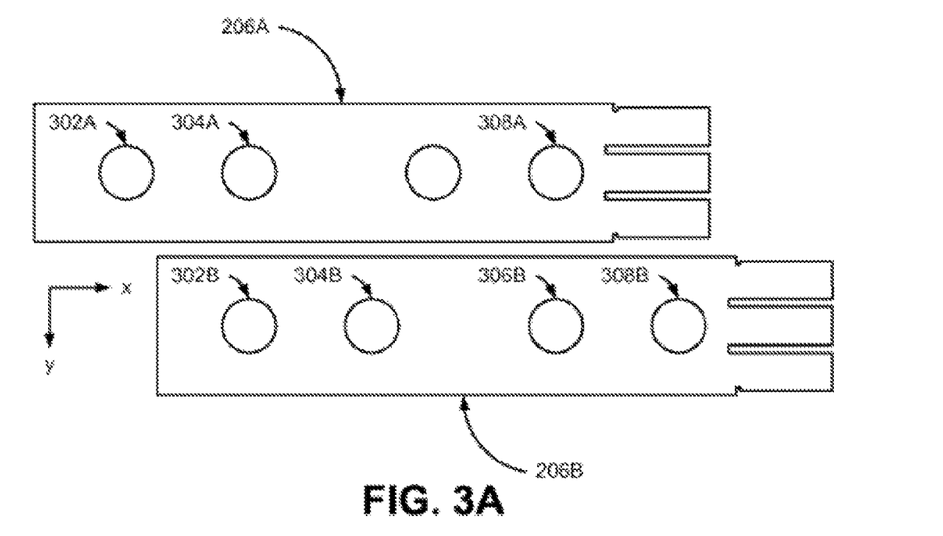
FIG. 3A is top-down view of the connecting fingers of the sliding bus bar power connector, according to one embodiment.
Figure 3B:
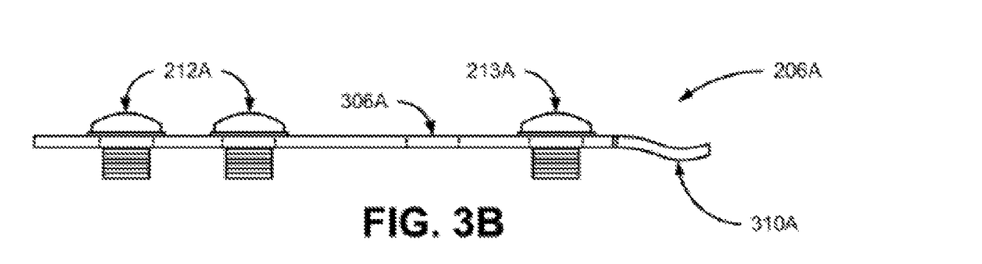
FIGS. 3B and 3C are side views of the connecting fingers of the sliding bus bar power connector, according to one embodiment.
Figure 3C:
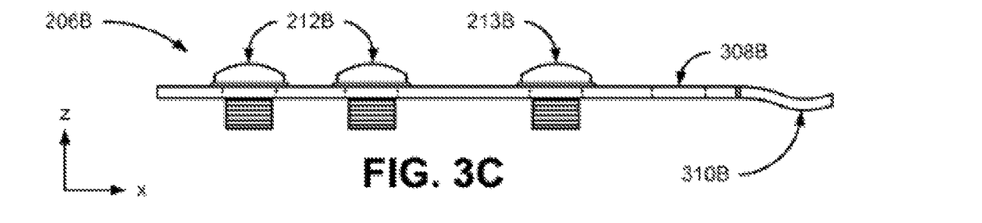

FIG. 3A is a top view of the two connecting fingers 206A, 206B. In the illustrated embodiment, each connecting finger 206A, 206B includes a series of four holes 302A, 304A, 306A, 308A, 302B, 304B, 306B, 308B for fastening the connecting finger 206A, 206B to the PCB 208 or to the carrier bracket 214. FIGS. 3B and 3C are side views of the two connecting fingers 206A, 206B. As described above with reference to FIG. 2A, fasteners 212A, 212B are inserted through the two holes 302, 304 of each connecting finger 206A, 206B to secure the connecting finger 206A, 206B to the PCB 208 and to the carrier bracket 214. Another fastener 213A is inserted through the fourth hole 308A to secure the first connecting finger 206A to the carrier bracket 214. Meanwhile, a fastener 213B is inserted through the third hole 306B to secure the second connecting finger 206B so that the third hole 306B is at the same position along the x-axis as the fourth hole 308A on the other connecting finger 206A. Securing the connecting fingers 206A, 206B in this manner causes the second connecting finger 206B to extend farther to the right than the first connecting finger 206A, so the second connecting finger 206B contacts the second bus bar 130B. Further, rather than using different connecting fingers having different length, this configuration allows the two connecting fingers 206A, 206B to have the same mechanical dimensions, lowering manufacturing costs and reducing the overall complexity of the sliding bus bar connector 120.

In some embodiments, the portion of the connecting finger 206A, 206B contacting the bus bar 130A, 130B has a downward curve. This prevents burrs on the edges of the connecting fingers 206A, 206B from damaging contacting strips 202A, 202 of the bus bars 130A, 130B.

Figure 4:
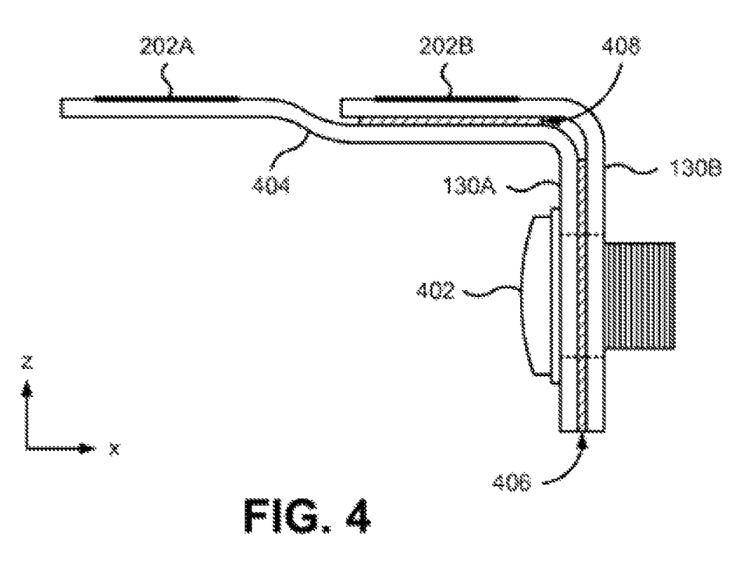
FIG. 4 is a cross-sectional view of the floating bus bars, according to one embodiment.

FIG. 4 is a cross-sectional view of one embodiment of the bus bars 130A, 130B. In the embodiment shown by FIG. 4, the cross section of two bus bars 130A, 130B has an L-shape allowing two bus bars 130A, 130B to be aligned and mechanically coupled to each other with one or more fasteners 402. An upper portion of the first bus bar 130A may have an upward curve 404 so that the conducting strips 202A, 202B of each of the bus bars 130A, 130B are positioned at the same height. Insulating sheets 406, 408 may be added in the space between the bus bars 130A, 130B to prevent short circuits. The insulating sheets 406, 408 may be omitted in embodiments where the non-contacting surfaces of the bus bars 130A, 130B are already covered with an insulating material, such as a powder coat.

Figure 5:
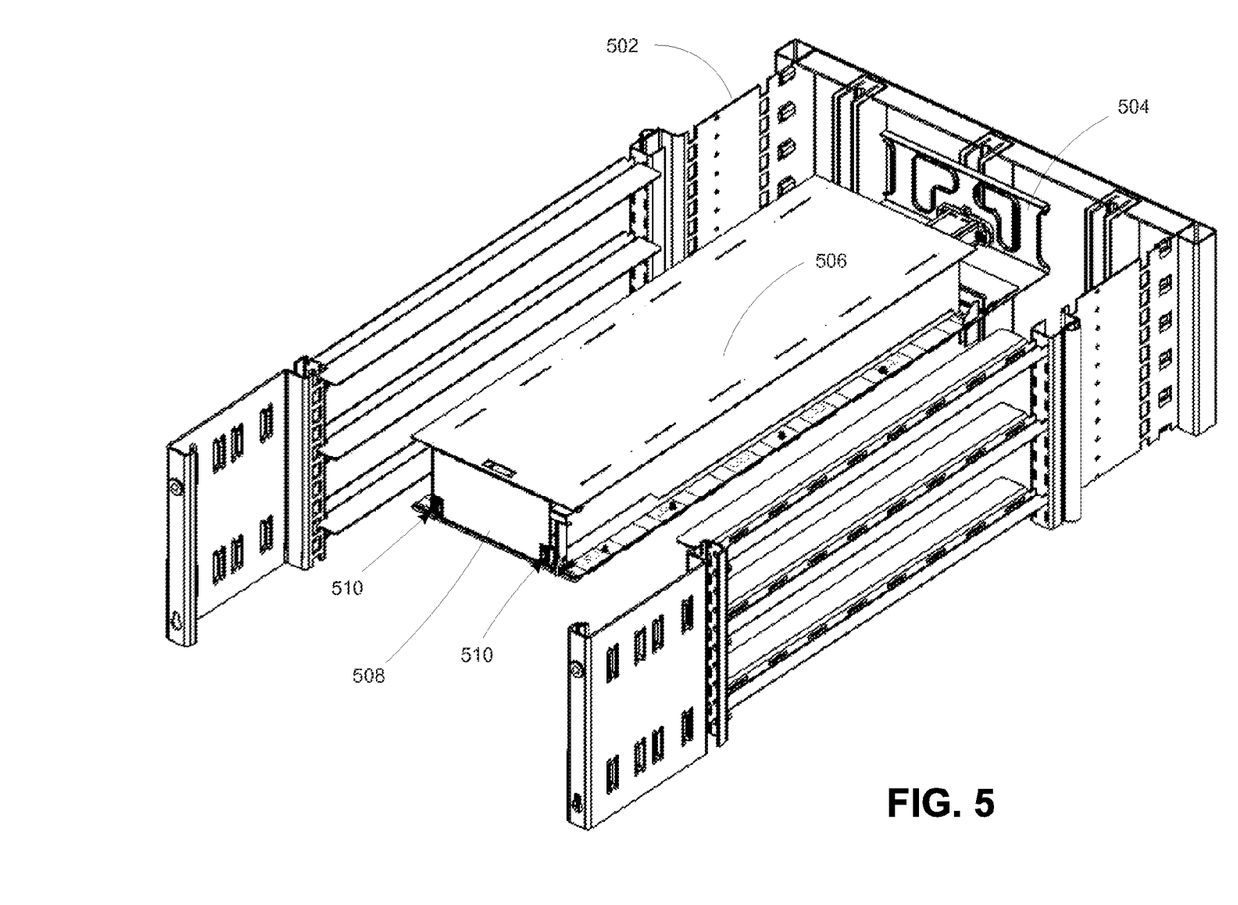
FIG. 5 is a perspective view illustrating a rack assembly according to a representative embodiment.

FIG. 5 illustrates a powered chassis 508 that is continuously powered by powered slide rails 510 as the chassis 508 is moved in and out of its corresponding cubby 506. Chassis 508 is housed in the cubby 506, which attaches to shelf 504. The chassis, cubby, and shelf are housed in a rack 502. Rack 502 can be any suitable server rack system as known in the art. Chassis 508 houses one or more computing assets, such as disk drives, fans, interface boards, and the like.

Figure 6:
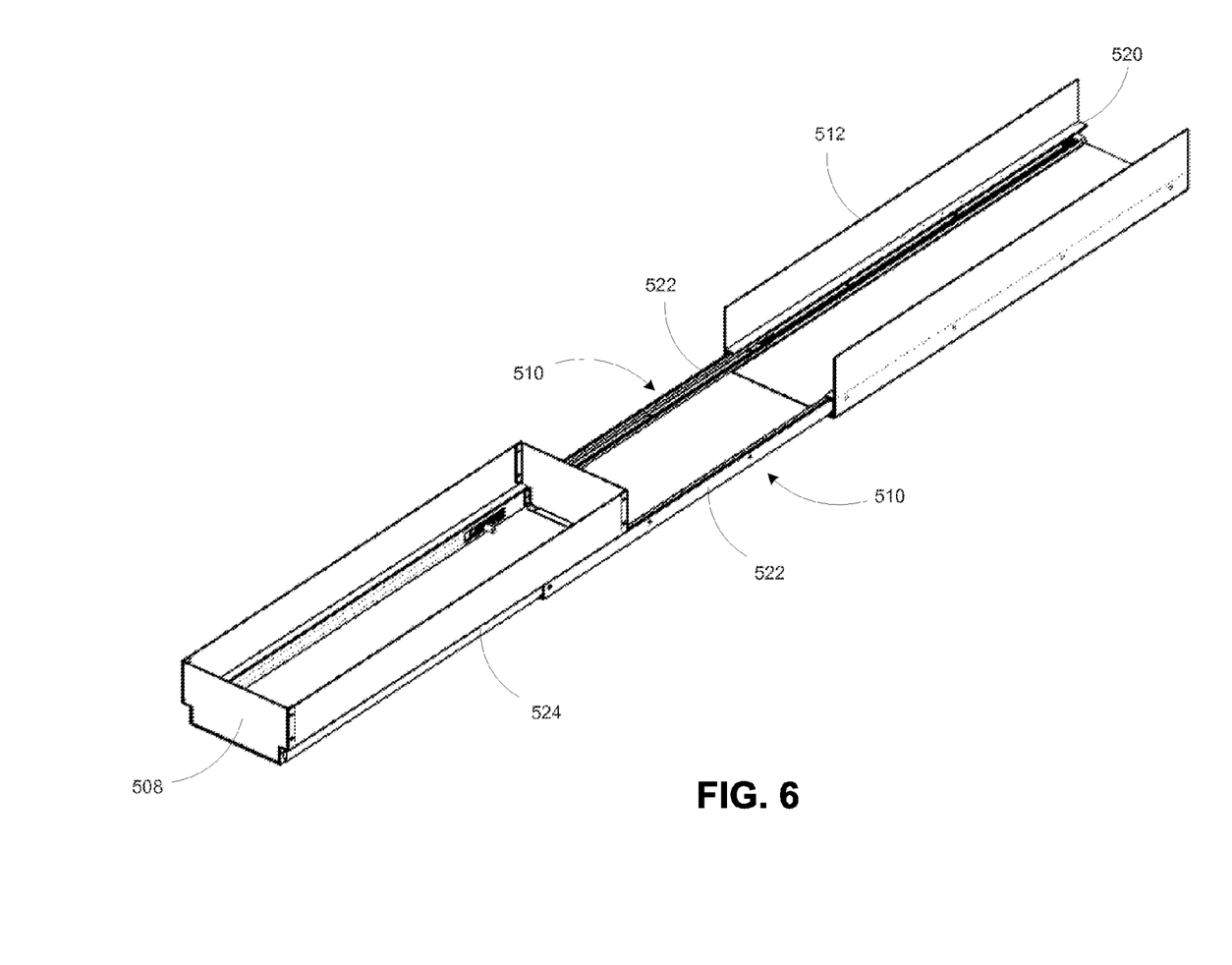
FIG. 6 is a perspective view of a chassis and base assembly incorporating powered slide bars.

With reference to FIG. 6, chassis 508 is housed in a base 512 which slides onto the cubby tray 506 (FIG. 5) and is retained thereon. Powered slide rails 510 allow chassis 508 to be moved in and out of base 512 for servicing while maintaining power to the chassis 508. Powered slide rails 510 also act as drawer slides that support chassis 508 as it is withdrawn from base 512.

Figure 7:
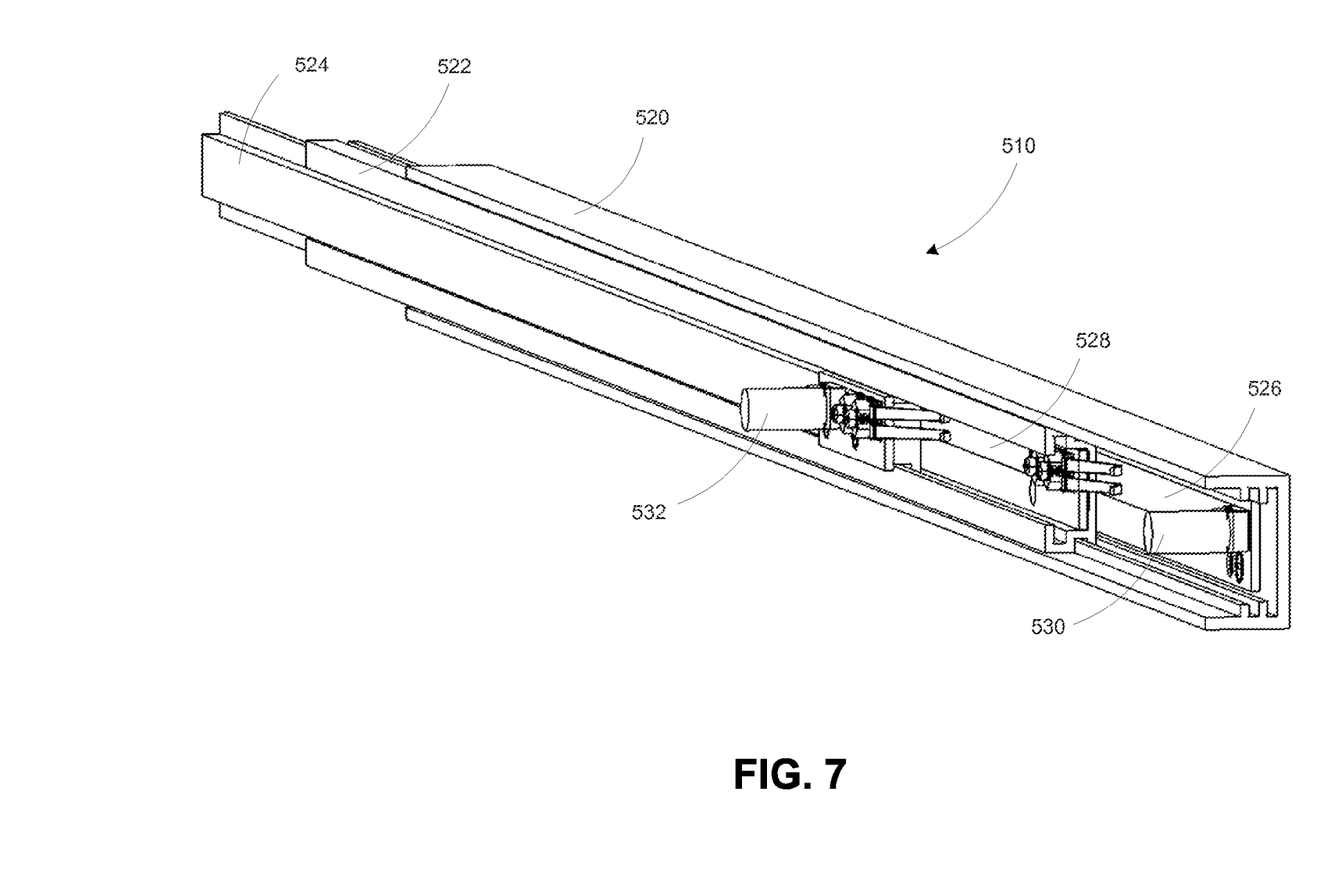
FIG. 7 is a perspective view of a powered slide bar in a collapsed state.

Powered slide rail 510 can include multiple slidably nested or telescoping segments. In an embodiment, each powered slide rail 510 includes an outer segment 520, a middle segment 522, and an inner segment 524 moveably extensible relative to each other. In the illustrated embodiment, the outer segment 520 is securely mounted to the base 512, and the inner segment 524 is securely mounted to the chassis 508. As shown in FIG. 7, the outer segment 520 includes an elongate conductor 526 and middle segment 522 includes an elongate conductor 528. The end of the elongate conductor 526 is operatively connected to an electrically conductive lug 530 coupled to a power source. Power supplied to the powered slide rail 510 via lug 530 travels along the elongate conductors 526 and 528 to an electrically conductive lug 532 connected to the inner segment 524 to provide power to computer assets within the chassis 508. Although this embodiment uses lugs 530 and 532 to connect to the powered slide bar, any suitable connector can be used.

Figure 8:
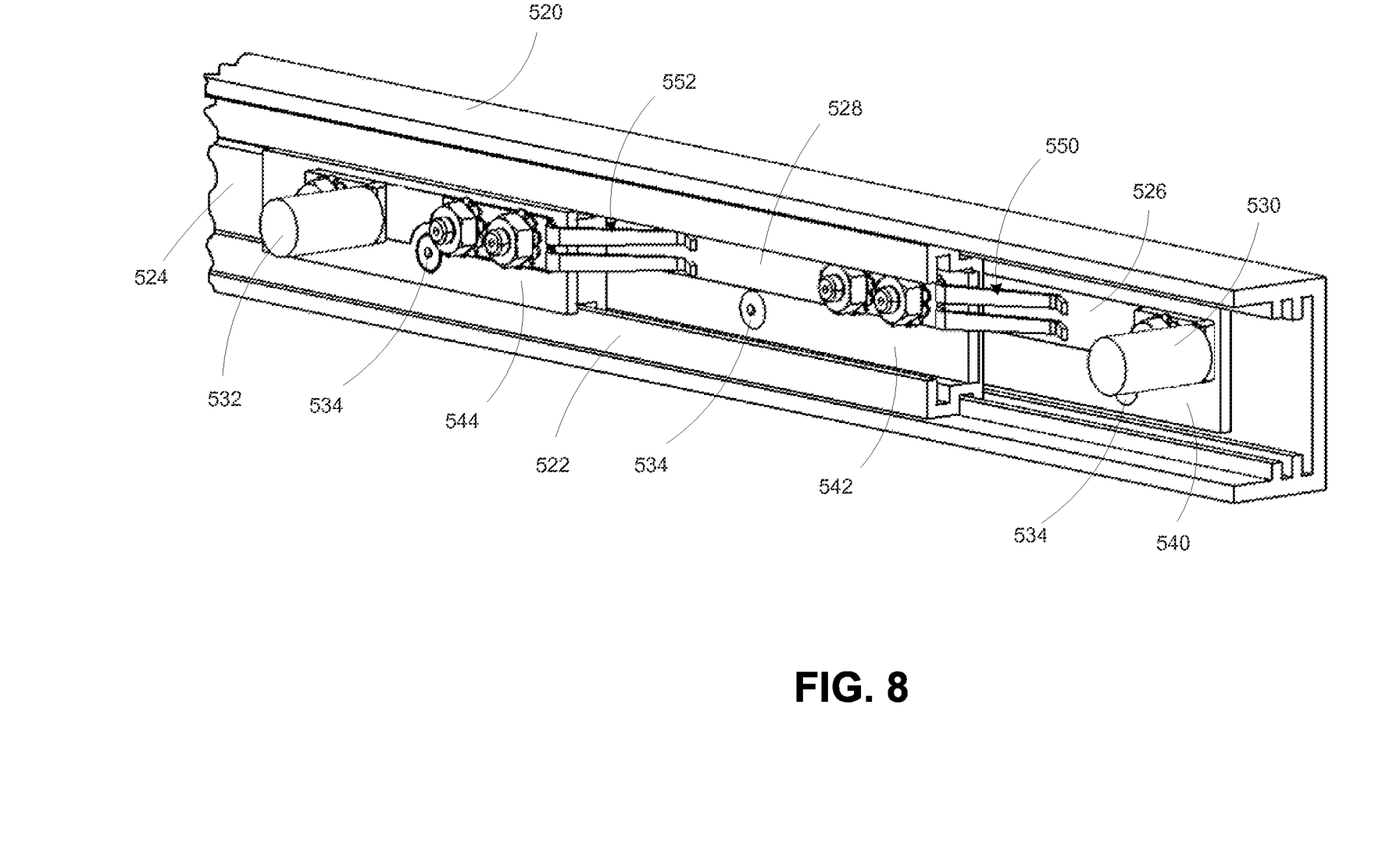
FIG. 8 is a partial perspective view of the powered slide bar shown in FIG. 7.

With reference to FIG. 8, power is transferred from elongate conductor 526 to elongate conductor 528 by a conductor element 550. Conductor element 550 is mounted on the middle segment 522 and is positioned for sliding contact with the elongate conductor 526 of outer segment 520. Similarly, power is transferred from elongate conductor 528 to lug 532 via conductive element 552. Conductive element 552 is mounted to inner segment 524 in electrical communication with lug 532.

In various embodiments, the elongate conductors 526 and 528 comprise traces on any suitable printed circuit board, such as circuit board 540 and 542, respectively. In some embodiments, the elongate conductors 526 and 528 are comprised of copper or other suitable conductive material. Elongate conductors 526 and 528 extend substantially the length of their respective telescoping segments. Accordingly, the segments can be extended with respect to each other with conductive elements 550 and 552 remaining in contact with elongate conductors 526 and 528, thereby continuously supplying power between lug 530 and lug 532 as the powered slide rail 510 is extended and collapsed.

Lug 532 and conductor element 552 are mounted to a circuit board 544 with a short trace therebetween to connect them for power transfer. Although the disclosed embodiments are described with respect to transferring or conducting power, in other embodiments the powered slide bars 510 can be used for data communication. Circuit boards 540, 542 and 544 may be attached to their respective segment with any suitable fastener such as press-in or self-clinching fasteners 534. Suitable fasteners are available from Penn Engineering of Danboro, Pa.

Figure 9:
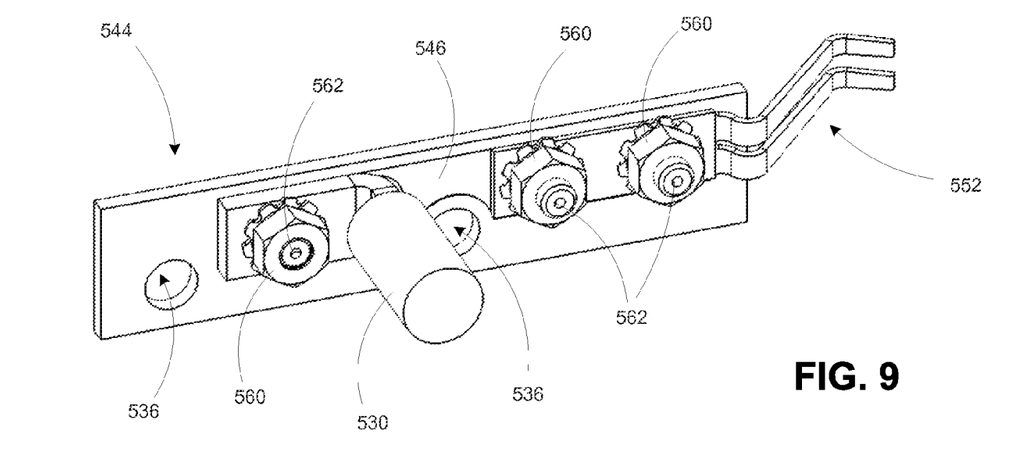
FIG. 9 is a perspective view of a conductor element circuit board.

FIG. 9 illustrates the components of circuit board 544 which includes conductor element 552 that is mounted to circuit board 544 with a pair of lock nuts 560. Lock nuts 560 are threaded onto studs 562 that can be pressed into the circuit board 544. Similarly, lug 530 is attached to circuit board 544 with a locking nut 560 which is fastened to a stud 562. Suitable press-in studs are available from Penn Engineering of Danboro, Pa. As mentioned above, a trace on circuit board 544 (e.g., trace 546) connects the conductor element 552 with lug 530. Circuit board 544 also includes a pair of apertures 536 which press onto fasteners 534, as shown in FIG. 8.

Figure 10:
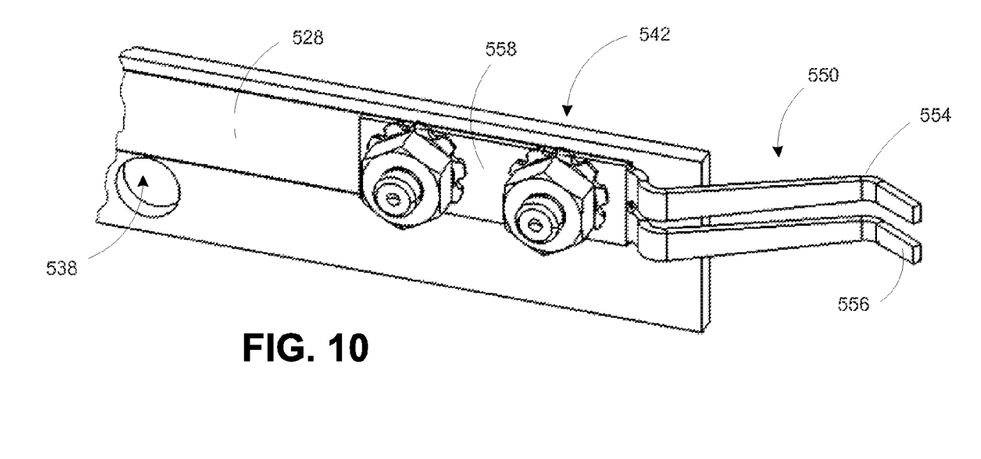
FIG. 10 is a partial perspective view of a conductor element circuit board.

FIG. 10 illustrates an end portion of circuit board 542 which carries elongate conductor 528. Circuit board 542 may also include apertures 538 to facilitate mounting the circuit board onto its respective telescoping segment. Conductive elements 552 and 550 are of similar construction. For example, conductor element 550 comprises a base portion 558 which is attached to circuit board 542 in electrical communication with elongate conductor 528. For example, base portion 558 can be placed on top of an end portion of elongate conductor 528. A pair of fingers 554 and 556 extend from the base portion 558. Fingers 554 and 556 are positioned to contact the elongate conductor of the adjacent segment. Although two fingers are shown in the figures, more or less fingers can be used. In some embodiments, the fingers 554 and 556 are spring biased toward the elongate conductor in order to remain in contact with the conductor.

Figure 11:
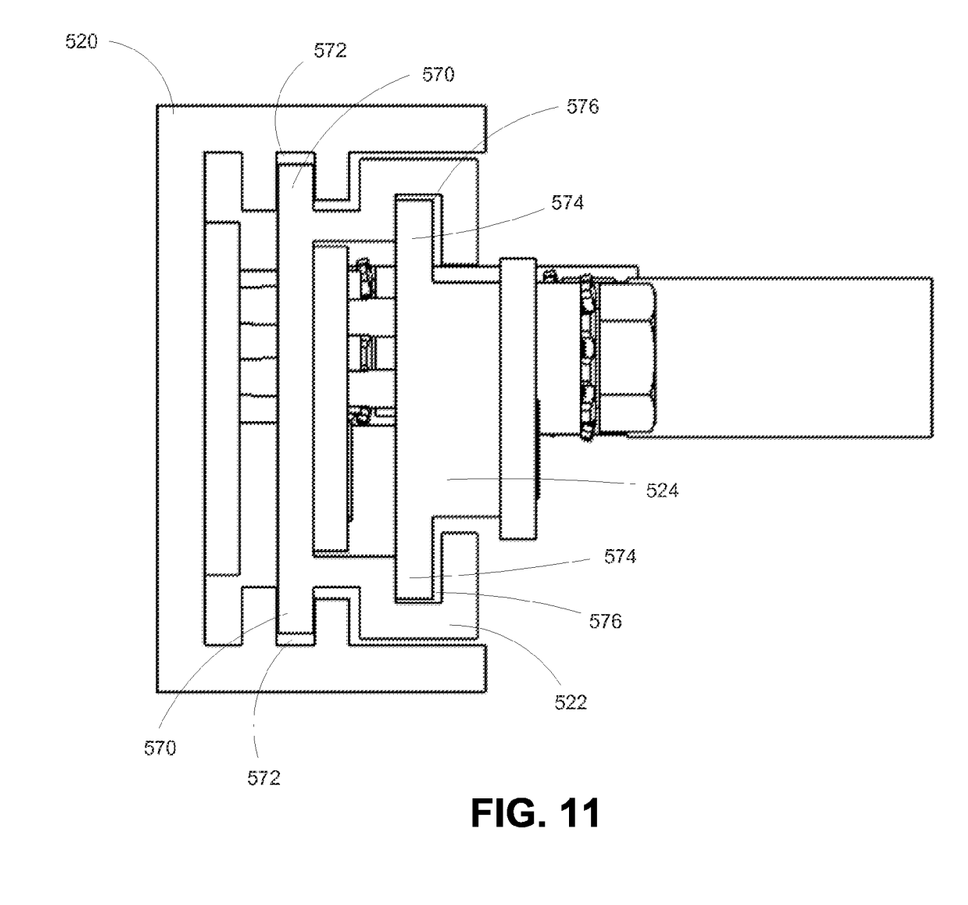
FIG. 11 is an end view of the powered slide bar.

FIG. 11 is an end view of the powered slide rail 510 illustrating the telescoping arrangement of the segments.

Outer segment 520 includes opposed grooves 572 that are configured to telescopically mate with flanges 570 extending from the middle telescoping segment 522. Telescoping segment 522 includes a pair of grooves 576 that are configured to telescopically mate with flanges 574 extending from the inner telescoping segment 524.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A powered slide rail, comprising:
   first and second telescoping segments slidably nested relative to each other;
   an elongate conductor disposed on a printed circuit board mounted to the first segment; and
   a conductive element mounted on the second segment and positioned for continuous sliding contact with the elongate conductor.

2. The powered slide rail according to claim 1, wherein the conductive element is spring biased toward the elongate conductor.

3. The powered slide rail according to claim 2, wherein the conductive element includes one or more fingers.

4. The powered slide rail according to claim 1, further comprising a connector in electrical communication with the elongate conductor.

5. The powered slide rail according to claim 1, further comprising a connector in electrical communication with the conductive element.

6. The powered slide rail according to claim 1, wherein the first segment includes opposed grooves and the second segment includes a pair of flanges mating with the opposed grooves.

7. A powered slide rail, comprising:
- an outer segment including a first elongate conductor on a first printed circuit board;
- a middle segment slidably nested with the outer segment and including a second elongate conductor on a second printed circuit board and a first conductive element connected to the second elongate conductor and biased toward the first elongate conductor for continuous sliding contact with the first elongate conductor; and
- an inner segment slidably nested with the middle segment and including a second conductive element biased toward the second elongate conductor for continuous sliding contact with the second elongate conductor.

8. The powered slide rail according to claim 7, wherein the first and second conductive elements each include one or more fingers.

9. The powered slide rail according to claim 7, further comprising a first connector in electrical communication with the first elongate conductor.

10. The powered slide rail according to claim 7, further comprising a second connector in electrical communication with the second conductive element.

11. The powered slide rail according to claim 7, wherein the outer segment includes opposed grooves and the middle segment includes a pair of flanges mating with the opposed grooves.

12. The powered slide rail according to claim 11, wherein the middle segment includes opposed middle grooves and the inner segment includes a pair of inner flanges mating with the opposed middle grooves.

13. A powered chassis, comprising
- a base;
- a chassis;
- a pair of powered slide rails, each comprising:
- an outer segment mounted to the base and including a first elongate conductor on a first printed circuit board;
- a middle segment telescopically attached to the outer segment and including a second elongate conductor on a second printed circuit board and a first conductive element connected to the second elongate conductor and biased toward the first elongate conductor for continuous sliding contact with the first elongate conductor; and
- an inner segment telescopically attached to the middle segment and attached to the chassis, the inner segment including a second conductive element biased toward the second elongate conductor for continuous sliding contact with the second elongate conductor.

14. The powered chassis according to claim 13, further comprising a first connector in electrical communication with the first elongate conductor and a second connector in electrical communication with the second conductive element.

15. The powered chassis according to claim 13, wherein the outer segment includes opposed grooves and the middle segment includes a pair of flanges mating with the opposed grooves and wherein the middle segment includes opposed middle grooves and the inner segment includes a pair of inner flanges mating with the opposed middle grooves.

* * * * *